United States Patent
Song et al.

(10) Patent No.: US 10,971,438 B2
(45) Date of Patent: Apr. 6, 2021

(54) CHIP-ON FILM AND DISPLAY DEVICE INCLUDING THE SAME

(71) Applicant: LG DISPLAY CO., LTD., Seoul (KR)

(72) Inventors: Jihun Song, Seoul (KR); Minseok Kim, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/824,168

(22) Filed: Nov. 28, 2017

(65) Prior Publication Data
US 2018/0151536 A1    May 31, 2018

(30) Foreign Application Priority Data
Nov. 30, 2016 (KR) .................. 10-2016-0161535

(51) Int. Cl.
| H01L 23/498 | (2006.01) |
| H01L 23/00 | (2006.01) |
| H01L 27/32 | (2006.01) |
| H01L 51/00 | (2006.01) |

(52) U.S. Cl.
CPC .. *H01L 23/49811* (2013.01); *H01L 23/49822* (2013.01); *H01L 23/49894* (2013.01); *H01L 24/29* (2013.01); *H01L 24/32* (2013.01); *H01L 24/50* (2013.01); *H01L 24/73* (2013.01); *H01L 24/83* (2013.01); *H01L 27/3276* (2013.01); *H01L 51/0097* (2013.01); *H01L 23/4985* (2013.01); *H01L 27/322* (2013.01); *H01L 51/003* (2013.01); *H01L 2224/2929* (2013.01); *H01L 2224/32227* (2013.01); *H01L 2224/50* (2013.01); *H01L 2224/73219* (2013.01); *H01L 2224/83005* (2013.01); *H01L 2224/83007* (2013.01); *H01L 2224/83851* (2013.01); *H01L 2224/86007* (2013.01); *H01L 2224/8685* (2013.01); *H01L 2224/86399* (2013.01); *H01L 2251/5338* (2013.01)

(58) Field of Classification Search
CPC ........... H01L 24/86; H01L 2224/73219; H01L 24/50
See application file for complete search history.

(56) References Cited

U.S. PATENT DOCUMENTS

| 4,530,863 | A | * | 7/1985 | Seeger | ....................... | B44C 3/06 156/58 |
| 5,122,215 | A | * | 6/1992 | Shibata | .................... | H01B 1/22 156/250 |
| 6,310,299 | B1 | * | 10/2001 | Kim | .................... | G02F 1/13452 174/256 |
| 9,113,545 | B2 | * | 8/2015 | Han | ......................... | H05K 7/00 |
| 2005/0151065 | A1 | * | 7/2005 | Min | ...................... | G09G 3/3406 250/214 R |
| 2011/0306703 | A1 | * | 12/2011 | Jeng | ...................... | C08G 59/066 523/400 |
| 2017/0287814 | A1 | * | 10/2017 | Kim | .................... | H01L 23/4985 |

* cited by examiner

*Primary Examiner* — Vincent Wall
(74) *Attorney, Agent, or Firm* — Birch, Stewart, Kolasch & Birch, LLP

(57) ABSTRACT

A chip-on film and a display device including the same are disclosed. The chip-on film includes a first base film, a second base film positioned on the first base film, a film pad portion positioned on at least one side of the second base film and exposed to the outside of the first base film, and a coating layer positioned on one surface of the first base film.

17 Claims, 14 Drawing Sheets

CHIP-ON FILM AND DISPLAY DEVICE INCLUDING THE SAME

This application claims the priority benefit of Korean Patent Application No. 10-2016-0161535 filed on Nov. 30, 2016, the disclosure of which is incorporated herein by reference in its entirety.

BACKGROUND OF THE INVENTION

Field of the Invention

The embodiments of the present disclosure relate to a chip-on film and a display device including the same.

Discussion of the Related Art

With the development of an information society, demands for display devices displaying an image are increasing in various ways. In the field of display devices, a large-sized cathode ray tube (CRT) has been rapidly replaced by a flat panel display (FPD) having advantages of a thin profile, light weight, and a large-sized screen. Examples of the flat panel display include a liquid crystal display (LCD), a plasma display panel (PDP), an organic light emitting diode (OLED) display, and an electrophoresis display (EPD).

An OLED display includes self-emitting elements capable of emitting light by themselves and has advantages of a fast response time, a high emission efficiency, a high luminance, and a wide viewing angle. In particular, the OLED display can be manufactured on a flexible plastic substrate. In addition, the OLED display has advantages of a lower driving voltage, lower power consumption, and better color tone as compared to a plasma display panel or an inorganic electroluminescent display.

In the OLED display manufactured on the flexible plastic substrate, polyimide is coated on a glass support substrate, elements such as a thin film transistor and an organic light emitting diode are manufactured on the polyimide substrate, and a chip-on film (COF) is attached to a pad portion. A process for separating the support substrate from the polyimide substrate is performed, and thus the OLED display including the flexible polyimide substrate is manufactured.

A process for attaching the chip-on film to the pad portion of the OLED display is performed by forming an anisotropic conductive film (ACF) on the chip-on film and then attaching the chip-on film to the pad portion through a tape-automated bonding (TAB) process. The TAB process pressurizes the pad portion, the anisotropic conductive film, and the chip-on film and electrically connects the pad portion to the chip-on film by conductive balls of the anisotropic conductive film. However, the anisotropic conductive film overflows from an end of the substrate depending on an amount or a pressure of the anisotropic conductive film. Thus, it is difficult to separate the support substrate and the polyimide substrate, which are attached by the anisotropic conductive film, from each other in a subsequent process.

SUMMARY OF THE INVENTION

The present disclosure provides a chip-on film and a display device including the same capable of preventing an anisotropic conductive film from overflowing from a substrate by forming a coating layer made of a material of the same kind as the anisotropic conductive film on the chip-on film.

The present disclosure also provides a chip-on film and a display device including the same capable of preventing a defective drive and improving production yield by giving reliability to a separation process of a glass substrate.

In one aspect, there is provided a chip-on film including a first base film, a second base film positioned on the first base film, a film pad portion positioned on at least one side of the second base film and exposed to the outside of the first base film, and a coating layer positioned on one surface of the first base film.

The coating layer is positioned on the one surface that is opposite from a surface that contacts the second base film.

The coating layer may have a varied thickness.

The coating layer is made of a thermosetting resin including at least one of a bisphenol-A epoxy resin, a bisphenol-F epoxy resin, a novolac epoxy resin, a phenol resin, a urea resin, a melamine resin, an unsaturated polyester resin or a resorcinol resin, or a thermoplastic resin including at least one of a saturated polyester resin, a vinyl resin, an acrylic resin, a polyolefin resin, a polyvinyl acetate (PVA) resin, a polycarbonate resin, a cellulose resin, a ketone resin or a styrene resin.

A width of the coating layer is more than two times a width of the film pad portion.

The coating layer includes an inclined portion on a side adjacent to the film pad portion.

The coating layer includes a plurality of uneven portions on a surface of the coating layer.

The coating layer is further positioned on a side surface of the first base film and a side surface of the second base film.

In another aspect, there is provided a display device including a flexible substrate, a display portion positioned on the flexible substrate, the display portion including an organic light emitting diode, a pad portion positioned at one edge of the flexible substrate, and a chip-on film connected to the pad portion through an anisotropic conductive film, wherein the chip-on film includes a first base film, a second base film positioned on the first base film, a film pad portion positioned on at least one side of the second base film and exposed to the outside of the first base film, and a coating layer positioned on one surface of the first base film, the coating layer being made of a material of the same kind as the anisotropic conductive film.

The anisotropic conductive film and the coating layer are made of a thermosetting resin including at least one of a bisphenol-A epoxy resin, a bisphenol-F epoxy resin, a novolac epoxy resin, a phenol resin, a urea resin, a melamine resin, an unsaturated polyester resin or a resorcinol resin, or a thermoplastic resin including at least one of a saturated polyester resin, a vinyl resin, an acrylic resin, a polyolefin resin, a polyvinyl acetate (PVA) resin, a polycarbonate resin, a cellulose resin, a ketone resin or a styrene resin.

The anisotropic conductive film is disposed to extend from the pad portion to the coating layer of the chip-on film.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail to embodiments of the disclosure, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the embodiments of the disclosure. Names of the respective elements used in the following explanations are selected only for convenience of writing the specification and may be thus different from those used in actual products.

A display device according to an embodiment of the disclosure is a flexible display device, in which a display element is formed on a flexible substrate. Examples of the flexible display device include an organic light emitting diode (OLED) display, a liquid crystal display (LCD), and an electrophoresis display. Embodiments of the disclosure are described using the OLED display by way of example. An OLED display includes an organic layer formed of an organic material between a first electrode serving as an anode and a second electrode serving as a cathode. The OLED display is a self-emission display device configured to form hole-electron pairs, i.e., excitons by combining holes received from the first electrode and electrons received from the second electrode inside the organic layer and emit light by energy generated when the excitons return to a ground level.

Embodiments of the disclosure are described below with reference to FIGS. 1 to 23.

Figure 1:
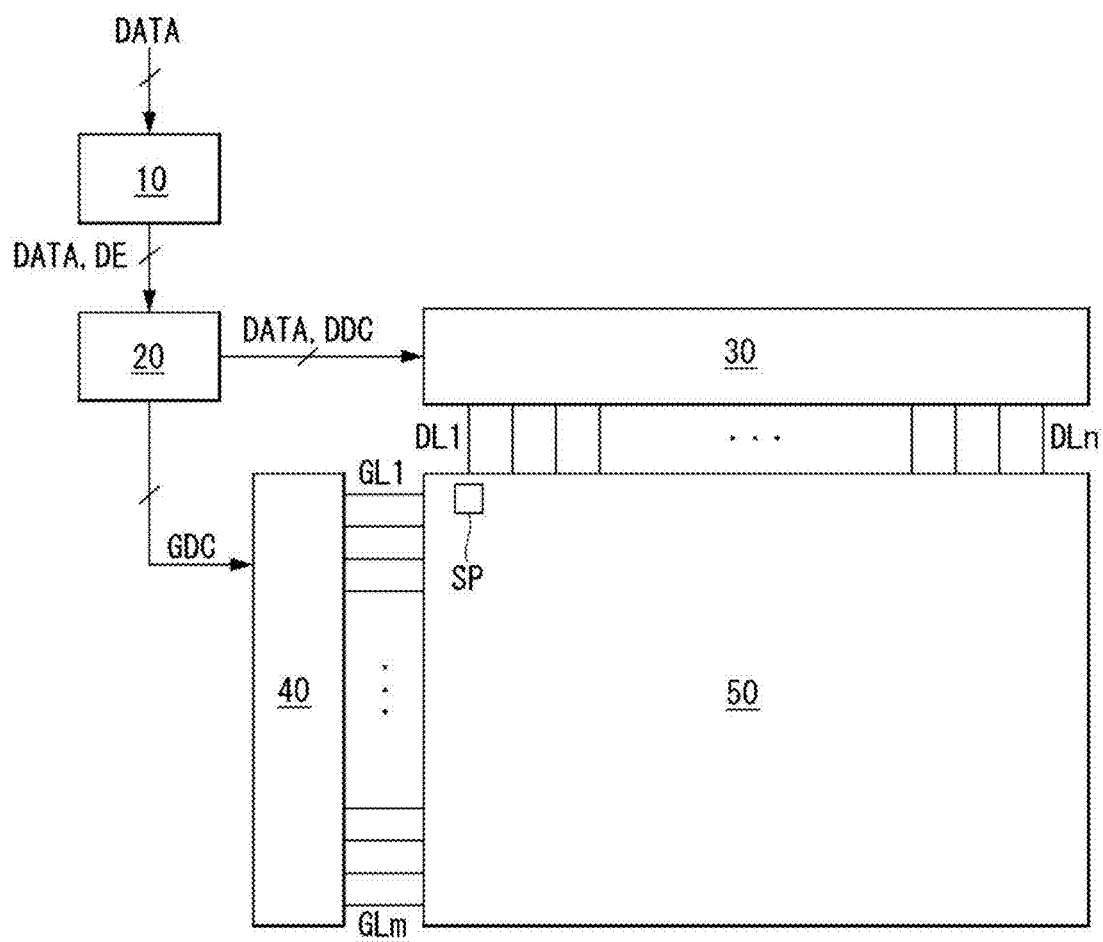
FIG. 1 is a schematic block diagram of an organic light emitting diode (OLED) display according to an embodiment of the disclosure.
Figure 2:
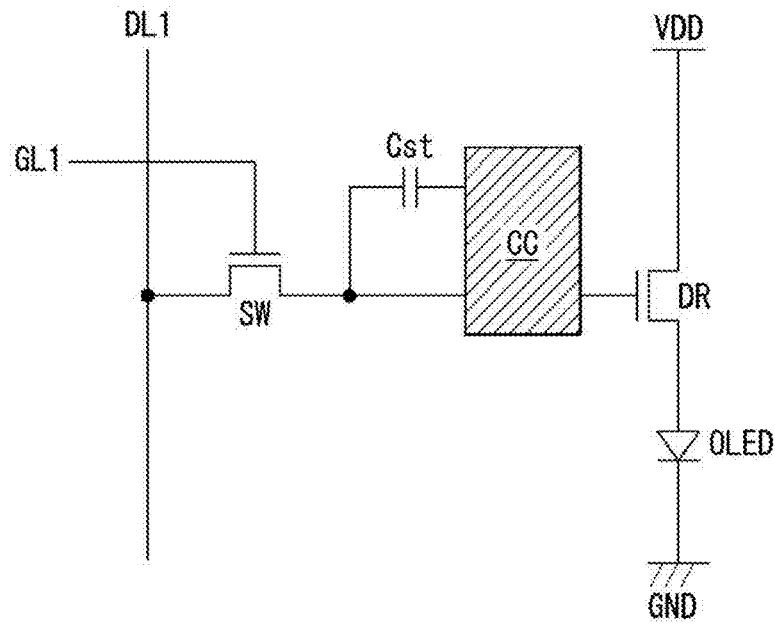
FIG. 2 illustrates a first example of a circuit configuration of a subpixel.
Figure 3:
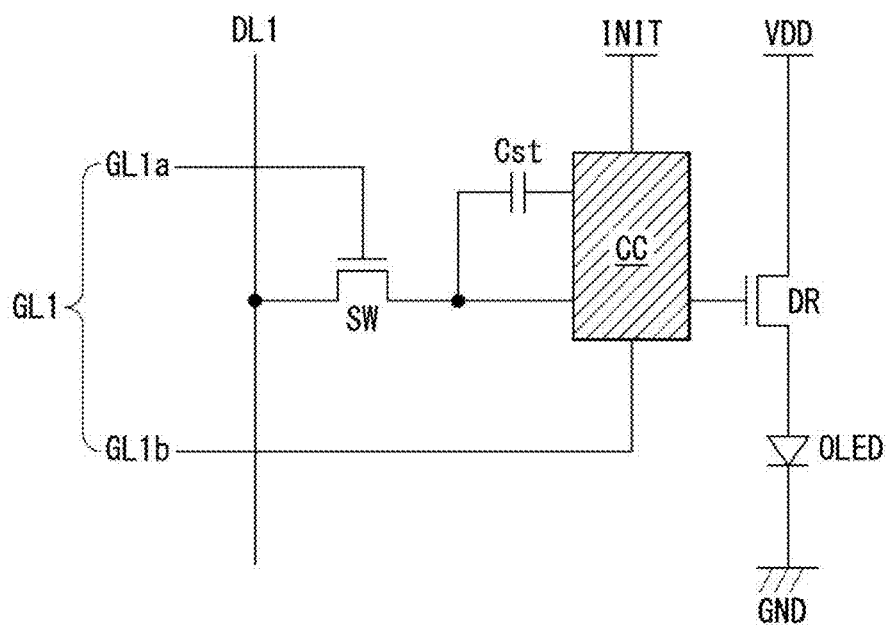
FIG. 3 illustrates a second example of a circuit configuration of a subpixel.

FIG. 1 is a schematic block diagram of an OLED display according to an embodiment of the disclosure. FIG. 2 illustrates a first example of a circuit configuration of a subpixel. FIG. 3 illustrates a second example of a circuit configuration of a subpixel.

Referring to FIG. 1, an OLED display according to an embodiment of the disclosure includes an image processing unit 10, a timing controller 20, a data driver 30, a gate driver 40, and a display panel 50.

The image processing unit 10 outputs a data signal DATA and a data enable signal DE supplied from the outside. The image processing unit 10 may output one or more of a vertical sync signal, a horizontal sync signal, and a clock signal in addition to the data enable signal DE. The image processing unit 10 is formed on a system circuit board as an integrated circuit (IC).

The timing controller 20 receives the data signal DATA and driving signals including the data enable signal DE or the vertical sync signal, the horizontal sync signal, the clock signal, etc. from the image processing unit 10.

The timing controller 20 outputs a gate timing control signal GDC for controlling operation timing of the gate driver 40 and a data timing control signal DDC for controlling operation timing of the data driver 30 based on the driving signals. The timing controller 20 may be formed on a control circuit board as an IC.

The data driver 30 samples and latches the data signal DATA received from the timing controller 20 in response to the data timing control signal DDC supplied from the timing controller 20 and converts the sampled and latched data signal DATA using gamma reference voltages. The data driver 30 outputs the converted data signal DATA to data lines DL1 to DLn. The data driver 30 is attached to a substrate as an IC.

The gate driver 40 outputs a gate signal while shifting a level of a gate voltage in response to the gate timing control signal GDC supplied from the timing controller 20. The gate driver 40 outputs the gate signal to gate lines GL1 to GLm. The gate driver 40 is formed on a gate circuit board as an IC or is formed on the display panel 50 in a gate-in-panel (GIP) manner.

The display panel 50 displays an image in response to the data signal DATA and the gate signal respectively received from the data driver 30 and the gate driver 40. The display panel 50 includes subpixels SP for displaying an image.

As shown in FIG. 2, each subpixel may include a switching transistor SW, a driving transistor DR, a compensation circuit CC, and an organic light emitting diode (OLED). The OLED operates to emit light based on a driving current generated by the driving transistor DR.

The switching transistor SW performs a switching operation so that a data signal supplied through a first data line DL1 is stored in a capacitor Cst as a data voltage in response to a gate signal supplied through a gate line GL1. The driving transistor DR enables a driving current to flow between a high potential power line VDD and a low potential power line GND based on the data voltage stored in the capacitor Cst. The compensation circuit CC is a circuit for compensating for a threshold voltage of the driving transistor DR. A capacitor connected to the switching transistor SW or the driving transistor DR may be mounted inside the compensation circuit CC. The compensation circuit CC includes one or more thin film transistors (TFTs) and a capacitor. Configuration of the compensation circuit CC may be variously changed depending on a compensation method. A brief description of the compensation circuit CC will be made.

As shown in FIG. 3, a subpixel including the compensation circuit CC may further include a signal line and a power line for driving a compensation TFT and supplying a predetermined signal or electric power. The gate line GL1 may include a 1-1 gate line GL1a supplying the gate signal to the switching transistor SW and a 1-2 gate line GL1b for driving the compensation TFT included in the subpixel. The added power line may be defined as an initialization power line INIT for initializing a predetermined node of the subpixel to a predetermined voltage. However, this is merely an example, and embodiments of the disclosure are not limited thereto.

FIGS. 2 and 3 illustrate that one subpixel includes the compensation circuit CC by way of example. However, the compensation circuit CC may be omitted when an object (for example, the data driver 30) to be compensated is positioned outside the subpixel. The subpixel has a configuration of 2T(Transistor)1C(Capacitor) in which the switching transistor SW, the driving transistor DR, the capacitor, and the OLED are provided. However, when the compensation circuit CC is added to the subpixel, the subpixel may have various configurations such as 3T1C, 4T2C, 5T2C, 6T2C, 7T2C, and the like. Also, FIGS. 2 and 3 illustrate that the compensation circuit CC is positioned between the switching transistor SW and the driving transistor DR by way of an example. However, the compensation circuit CC may be further positioned between the driving transistor DR and the OLED. The position and the structure of the compensation circuit CC are not limited to the ones illustrated in FIGS. 2 and 3.

Figure 4:
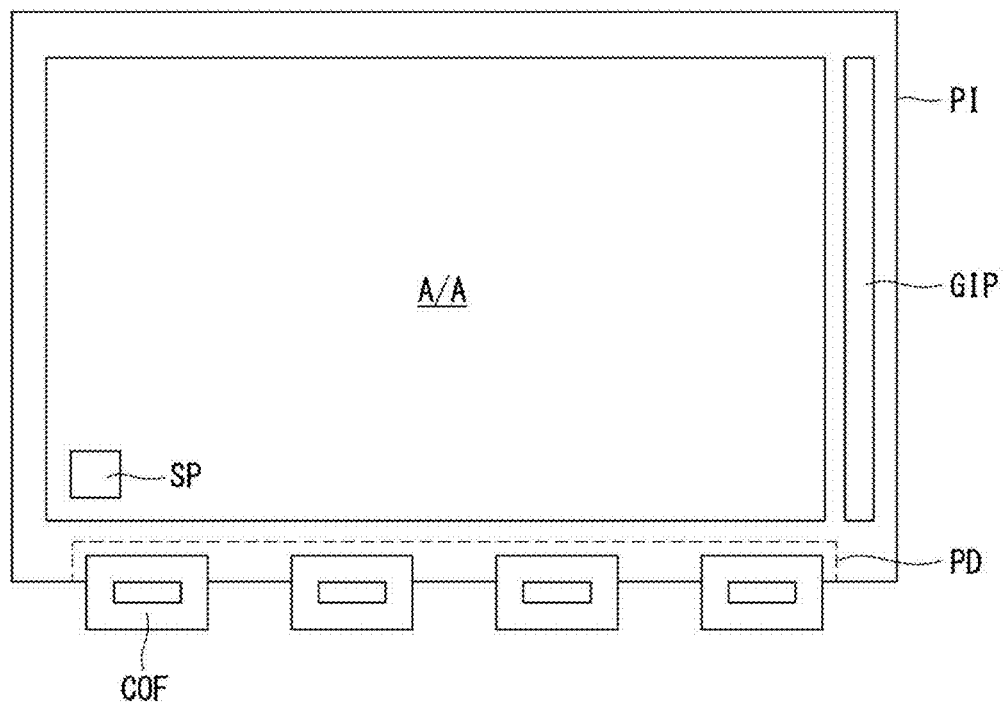
FIG. 4 is a plan view of an OLED display according to an embodiment of the disclosure.
Figure 5:
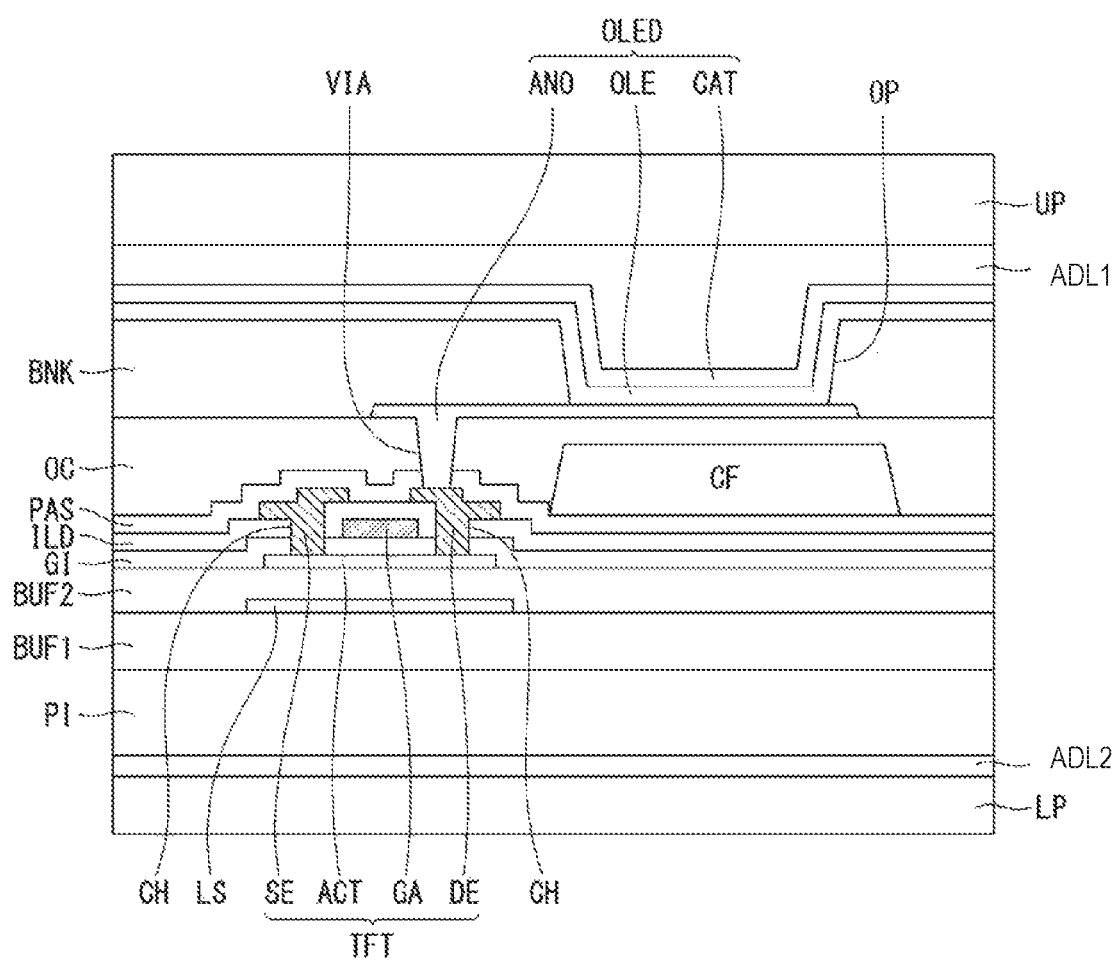
FIG. 5 is a cross-sectional view illustrating a subpixel of an OLED display according to an embodiment of the disclosure.
Figure 6:
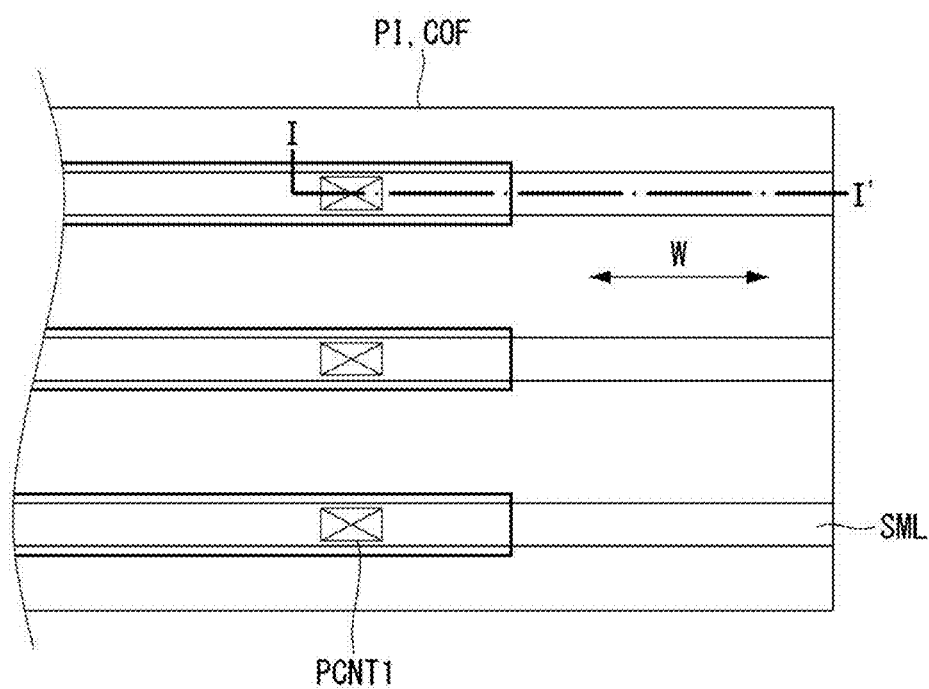
FIG. 6 is an enlarged plan view of a pad portion shown in FIG. 4.
Figure 7:
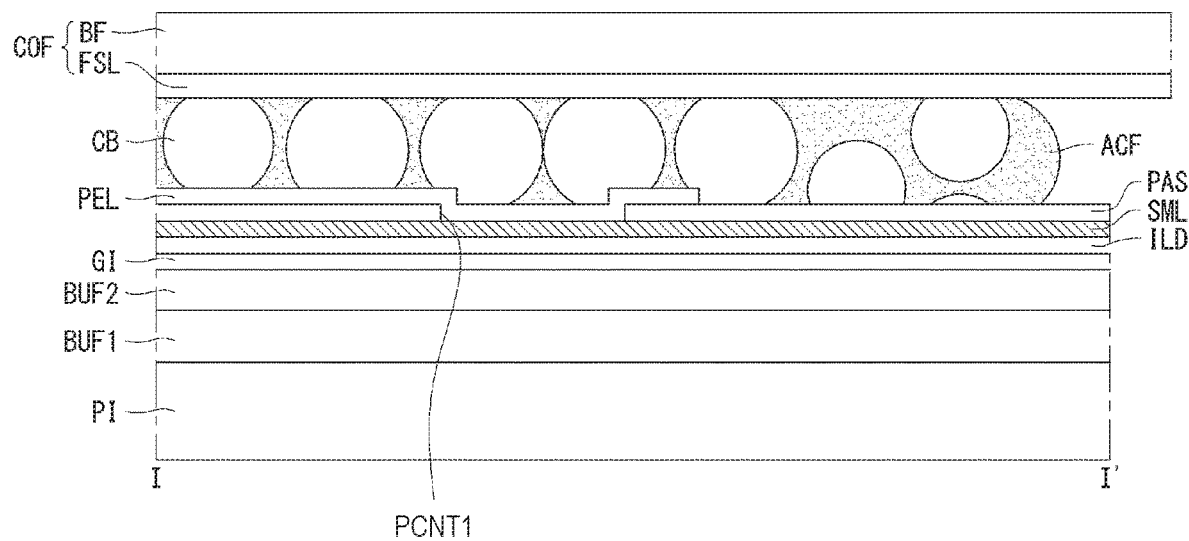
FIG. 7 is a cross-sectional view taken along line I-I' of FIG. 6.
Figure 8:
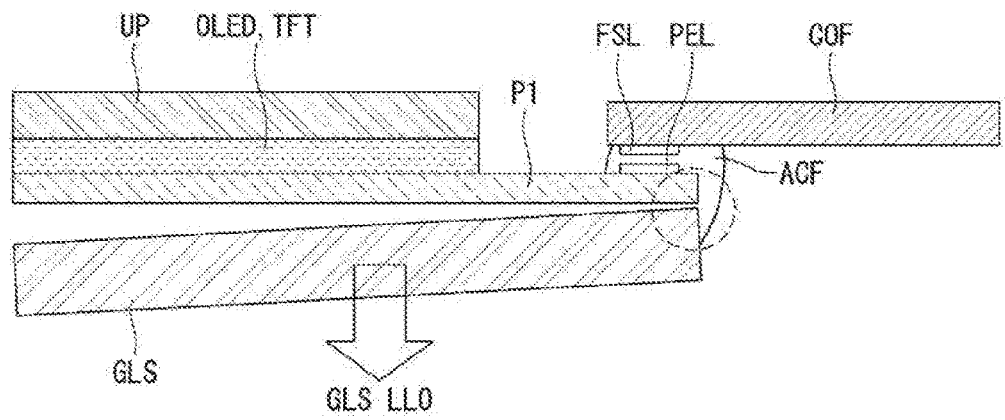
FIG. 8 is a cross-sectional view illustrating a process for separating a support substrate from a substrate.
Figure 9:
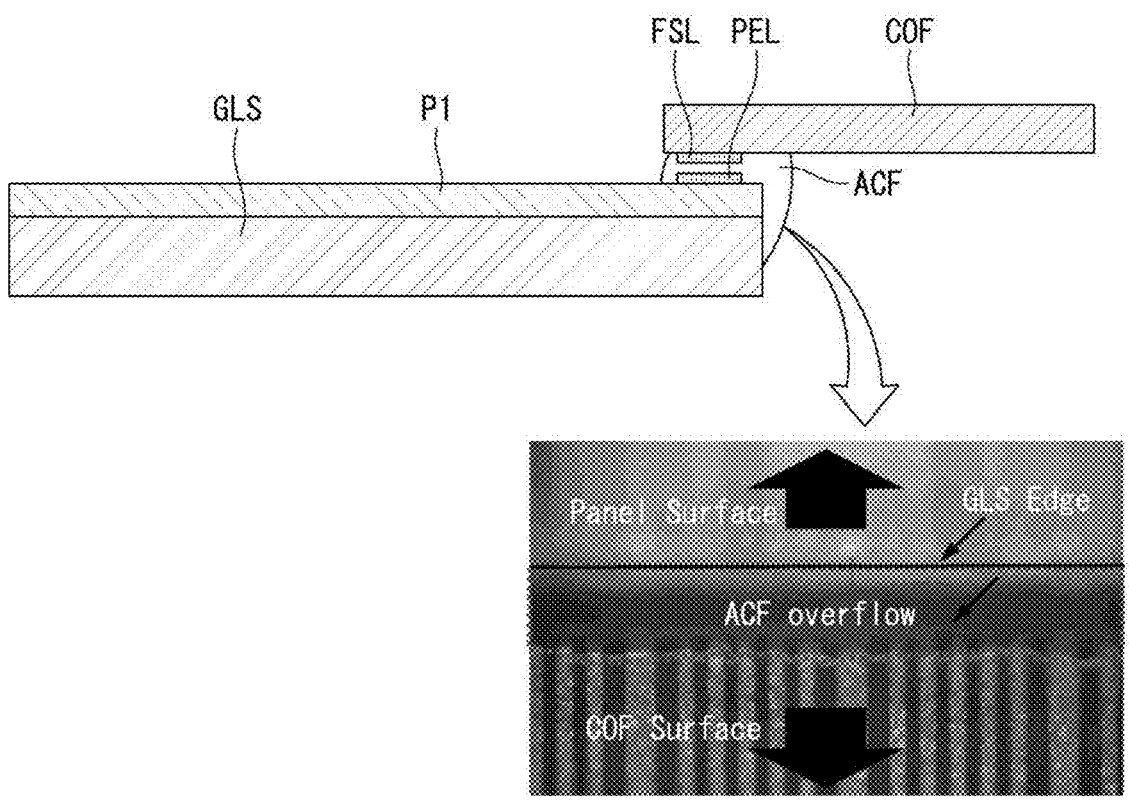
FIG. 9 is an image illustrating the overflow of an anisotropic conductive film.

FIG. 4 is a plan view of an OLED display according to an embodiment of the disclosure. FIG. 5 is a cross-sectional view illustrating a subpixel of an OLED display according to an embodiment of the disclosure. FIG. 6 is an enlarged plan view of a pad portion shown in FIG. 4. FIG. 7 is a cross-sectional view taken along line I-I' of FIG. 6. FIG. 8 is a cross-sectional view illustrating a process for separating a support substrate from a substrate. FIG. 9 is an image illustrating the overflow of an anisotropic conductive film.

Referring to FIG. 4, an OLED display includes a flexible substrate PI (or P1), a display portion A/A, a GIP driver GIP disposed on a right side of the flexible substrate PI outside the display portion A/A, and a pad portion PD disposed on a lower side of the flexible substrate PI. The display portion A/A may include a plurality of subpixels SP. For example, R (red), G (green), and B (blue) subpixels or R, B, and W (white) subpixels of the display portion A/A may emit light to represent a full color. The GIP driver GIP is disposed on one side, for example, the right side of the display portion A/A and applies a gate driving signal to the display portion A/A. Chip-on films COF are attached to the pad portion PD disposed on one side, for example, the lower side of the display portion A/A. A data signal and electric power are applied to a plurality of signal lines connected to the display portion A/A through the chip-on films COF.

A cross-sectional structure of a subpixel SP of the OLED display according to the embodiment of the disclosure is described below with reference to FIG. 5.

As shown in FIG. 5, in the OLED display according to the embodiment of the disclosure, a first buffer layer BUF1 is positioned on the flexible substrate PI. The flexible substrate PI may be, for example, a polyimide substrate. Thus, the flexible substrate PI according to the embodiment of the disclosure may have flexible characteristic. The first buffer layer BUF1 protects a thin film transistor formed in a subsequent process from impurities, for example, alkali ions discharged from the flexible substrate PI. The first buffer layer BUF1 may be formed of a silicon oxide (SiOx) layer, a silicon nitride (SiNx) layer, or a multilayer thereof.

A shield layer LS is positioned on the first buffer layer BUF1. The shield layer LS prevents a reduction in a panel driving current which may be generated by using a polyimide substrate. A second buffer BUF2 is positioned on the shield layer LS. The second buffer BUF2 protects a thin film transistor formed in a subsequent process from impurities, for example, alkali ions discharged from the shield layer LS. The second buffer layer BUF2 may be formed of a silicon oxide (SiOx) layer, a silicon nitride (SiNx) layer, or a multilayer thereof.

A semiconductor layer ACT is positioned on the second buffer layer BUF2 and may be formed of a silicon semiconductor or an oxide semiconductor. The silicon semiconductor may include amorphous silicon or crystallized polycrystalline silicon. The polycrystalline silicon has high mobility (for example, more than 100 $cm^2/Vs$), low power consumption, and excellent reliability. Thus, the polycrystalline silicon can be applied to a gate driver and/or a multiplexer (MUX) for use in a driving element or applied for a driving TFT of each pixel of the OLED display. Because the oxide semiconductor has a low OFF-current, the oxide semiconductor is suitable for a switching TFT which has a short ON-time and a long OFF-time. Further, because the oxide semiconductor increases a voltage hold time of the pixel due to the low OFF-current, the oxide semiconductor is suitable for a display device requiring a low-speed drive and/or low power consumption. In addition, the semiconductor layer ACT includes a drain region and a source region each including p-type or n-type impurities, and also includes a channel region between the drain region and the source region.

A gate insulating layer GI is positioned on the semiconductor layer ACT and may be formed of a silicon oxide (SiOx) layer, a silicon nitride (SiNx) layer, or a multilayer thereof. A gate electrode GA is positioned on the gate insulating layer GI at a location corresponding to a predetermined region (i.e., the channel region when impurities are injected) of the semiconductor layer ACT. The gate electrode GA may be formed of one of molybdenum (Mo), aluminum (Al), chrome (Cr), gold (Au), titanium (Ti), nickel (Ni), neodymium (Nd), copper (Cu), or a combination thereof. Further, the gate electrode GA may be a multilayer formed of one of molybdenum (Mo), aluminum (Al), chrome (Cr), gold (Au), titanium (Ti), nickel (Ni), neodymium (Nd), copper (Cu), or a combination thereof. For example, the gate electrode GA may be formed as a double layer of Mo/Al—Nd or Mo/Al.

An interlayer dielectric layer ILD is positioned on the gate electrode GA and insulates the gate electrode GA. The interlayer dielectric layer ILD may be formed of a silicon oxide (SiOx) layer, a silicon nitride (SiNx) layer, or a multilayer thereof. Contact holes CH exposing a portion of the semiconductor layer ACT are formed at a portion where each of the interlayer dielectric layer ILD and the gate insulating layer GI is formed.

A drain electrode DE and a source electrode SE are positioned on the interlayer dielectric layer ILD. The drain electrode DE is connected to the semiconductor layer ACT through the contact hole CH exposing the drain region of the semiconductor layer ACT, and the source electrode SE is connected to the semiconductor layer ACT through the contact hole CH exposing the source region of the semiconductor layer ACT. Each of the source electrode SE and the drain electrode DE may be formed as a single layer or as a multilayer. When each of the source electrode SE and the drain electrode DE is formed as the single layer, each of the source electrode SE and the drain electrode DE may be formed of one of molybdenum (Mo), aluminum (Al), chrome (Cr), gold (Au), titanium (Ti), nickel (Ni), neodymium (Nd), copper (Cu), or a combination thereof. When each of the source electrode SE and the drain electrode DE is formed as the multilayer, each of the source electrode SE and the drain electrode DE may be formed as a double layer of Mo/Al—Nd or as a triple layer of Ti/Al/Ti, Mo/Al/Mo or Mo/Al-Nd/Mo. Thus, a thin film transistor TFT including the semiconductor layer ACT, the gate electrode GA, the source electrode SE, and the drain electrode DE is formed.

Further, a passivation layer PAS is positioned on the flexible substrate PI including the thin film transistor TFT. The passivation layer PAS is an insulating layer protecting the component underlying the passivation layer PAS and may be formed of a silicon oxide (SiOx) layer, a silicon nitride (SiNx) layer, or a multilayer thereof. A color filter CF is positioned on the passivation layer PAS. The color filter CF serves to convert white light emitted by an organic light emitting diode OLED into red, green, or blue light. An overcoat layer OC is positioned on the color filter CF. The overcoat layer OC may be a planarization layer for reducing a height difference (or step coverage) of an underlying structure and may be formed of an organic material such as polyimide, benzocyclobutene-based resin, and acrylate. For example, the overcoat layer OC may be formed through a spin-on glass (SOG) method for coating the organic material in a liquid state and then curing the organic material.

A via hole VIA exposing the drain electrode DE of the thin film transistor TFT is positioned in a portion of the overcoat layer OC. The organic light emitting diode OLED is positioned on the overcoat layer OC. More specifically, a first electrode ANO is positioned on the overcoat layer OC. The first electrode ANO serves as a pixel electrode and is connected to the drain electrode DE of the thin film transistor TFT through the via hole VIA. The first electrode ANO is an anode and may be formed of a transparent conductive material such as indium tin oxide (ITO), indium zinc oxide (IZO), and zinc oxide (ZnO). When the first electrode ANO is a reflective electrode, the first electrode ANO may further include a reflective layer. The reflective layer may be formed of aluminum (Al), copper (Cu), silver (Ag), nickel (Ni), palladium (Pd) or a combination thereof. For example, the reflective layer may be formed of an Ag/Pd/Cu (APC) alloy.

In addition, a bank layer BNK defining pixels is positioned on the flexible substrate PI including the first electrode ANO. The bank layer BNK may be formed of an organic material such as polyimide, benzocyclobutene-based resin, and acrylate. The bank layer BNK includes a pixel definition portion OP exposing the first electrode ANO. An organic layer OLE contacting the first electrode ANO is positioned at a front surface of the flexible substrate PI. The organic layer OLE is a layer, in which electrons and holes combine and emit light. A hole injection layer and/or a hole transport layer may be positioned between the organic layer OLE and the first electrode ANO, and an electron injection layer and/or an electron transport layer may be positioned on the organic layer OLE.

A second electrode CAT is positioned on the organic layer OLE and may be positioned on the entire surface of the display area A/A (see FIG. 4). In addition, the second electrode CAT is a cathode electrode and may be formed of magnesium (Mg), calcium (Ca), aluminum (Al), silver (Ag), or a combination thereof each having a low work function. When the second electrode CAT is a transmissive electrode, the second electrode CAT may be thin enough to transmit light. Further, when the second electrode CAT is a reflective electrode, the second electrode CAT may be thick enough to reflect light.

An upper protective member UP is attached to an upper surface of the flexible substrate PI, on which the thin film transistor TFT and the organic light emitting diode OLED are formed, through an adhesive layer ADL1. The upper protective member UP may be a transparent flexible substrate or a metal thin film. Further, a lower protective member LP is attached to a lower surface of the flexible substrate PI through an adhesive layer ADL2. Because the lower protective member LP has to transmit light, the lower protective member LP may be formed of a transparent plastic film.

The pad portion PD is described below with reference to FIGS. 6 and 7. The first buffer layer BUF1 is positioned on the flexible substrate PI, and the second buffer BUF2 is positioned on the first buffer layer BUF1. The gate insulating layer GI is positioned on the second buffer BUF2, and the interlayer dielectric layer ILD is positioned on the gate insulating layer GI. A source metal layer SML is positioned on the interlayer dielectric layer ILD. The source metal layer SML is a source signal line extended from the display portion A/A. The passivation layer PAS is positioned on the source metal layer SML. The passivation layer PAS has a first contact hole PCNT1 exposing a portion of the source metal layer SML. A pad electrode PEL is positioned on the passivation layer PAS. The pad electrode PEL may be formed of the same material as the first electrode of the display portion and is connected to the source metal layer SML through the first contact hole PCNT1 of the passivation layer PAS. Thus, the pad portion PD including the first buffer layer BUF1, the second buffer layer BUF2, the gate insulating layer GI, the interlayer dielectric layer ILD, the source metal layer SML, the passivation layer PAS, and the pad electrode PEL is configured.

The chip-on film COF is attached to the flexible substrate PI, on which the pad portion PD is disposed, through an anisotropic conductive film ACF. The chip-on film COF may be a flexible printed circuit board mounted with a driver IC. The chip-on film COF includes a base film BF and a film line FSL on the base film BF. The chip-on film COF is attached to the anisotropic conductive film ACF and then is attached to the pad portion PD through a tape-automated bonding (TAB) process. The TAB process pressurizes the flexible substrate PI, the anisotropic conductive film ACF, and the chip-on film COF and electrically connects the pad portion PD to the chip-on film COF by conductive balls CB of the anisotropic conductive film ACF.

Referring to FIGS. 8 and 9, the display device according to the embodiment of the disclosure performs a process for separating a support substrate GLS supporting the flexible substrate PI after performing the TAB process on the chip-on film COF. However, in the TAB process, the anisotropic conductive film ACF overflows from an end of the flexible substrate PI depending on an amount or a pressure of the anisotropic conductive film ACF. Thus, it is difficult to separate the support substrate GLS and the polyimide substrate PI, which are attached by the anisotropic conductive film ACF, from each other.

Accordingly, the embodiment of the disclosure provides the chip-on film COF capable of preventing the anisotropic conductive film ACF from overflowing from the support substrate GLS by forming a coating layer made of a material of the same kind as the anisotropic conductive film ACF on the chip-on film COF.

Figure 10:
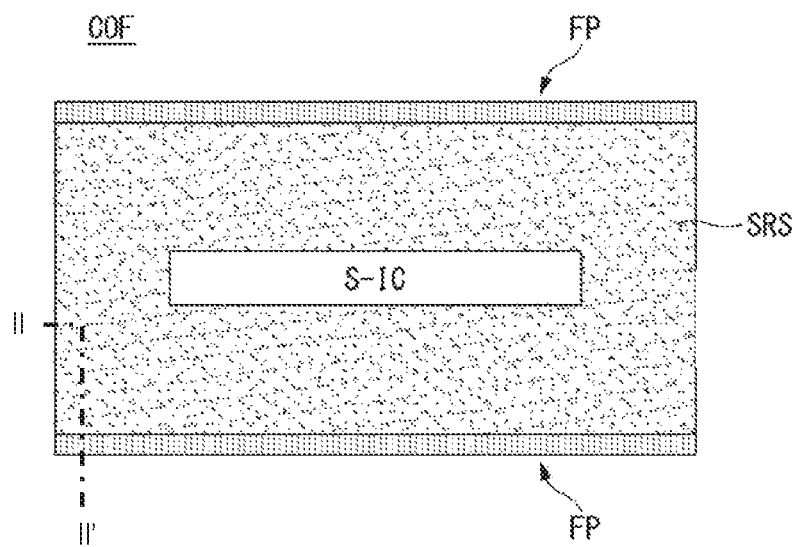
FIG. 10 is a plan view of a chip-on film according to an embodiment of the disclosure.
Figure 11:
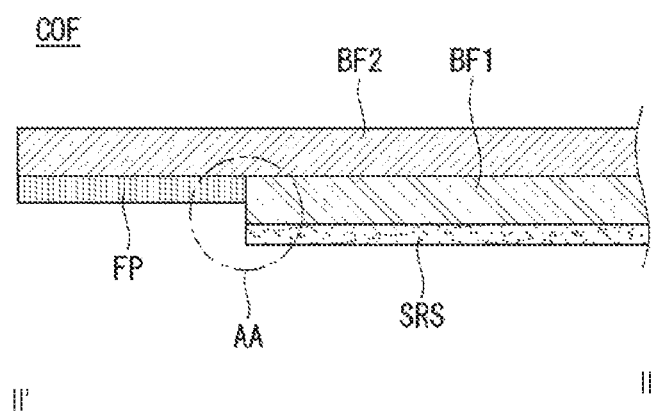
FIG. 11 is a cross-sectional view of a chip-on film according to an embodiment of the disclosure.
Figure 12:
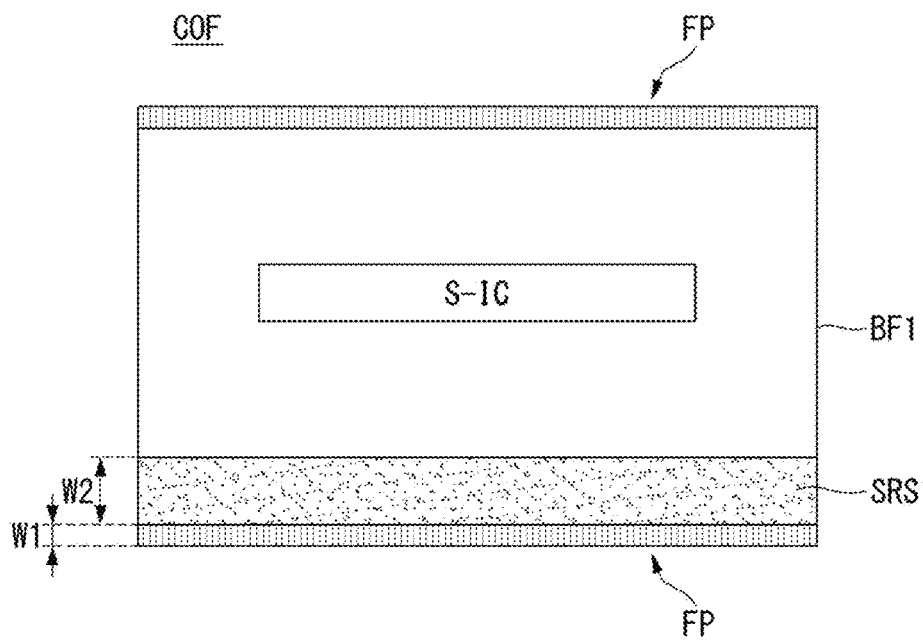
FIG. 12 is a plan view of a chip-on film according to another embodiment of the disclosure.
Figure 13:
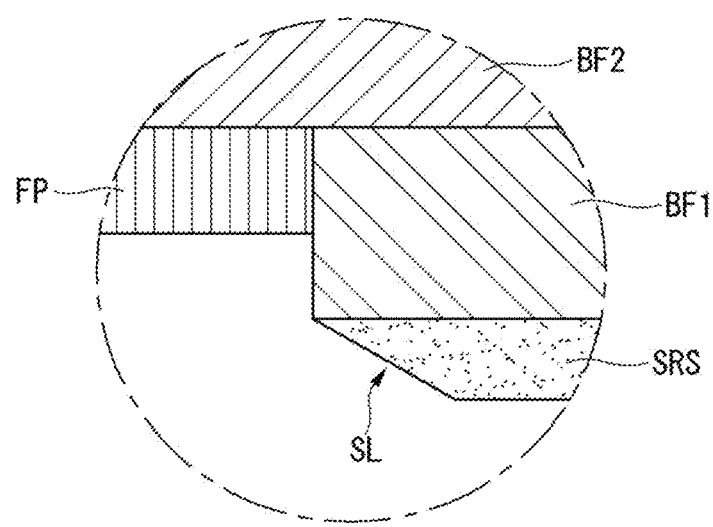
FIGS. 13 and 14 are enlarged views of an area AA of FIG. 11.
Figure 14:
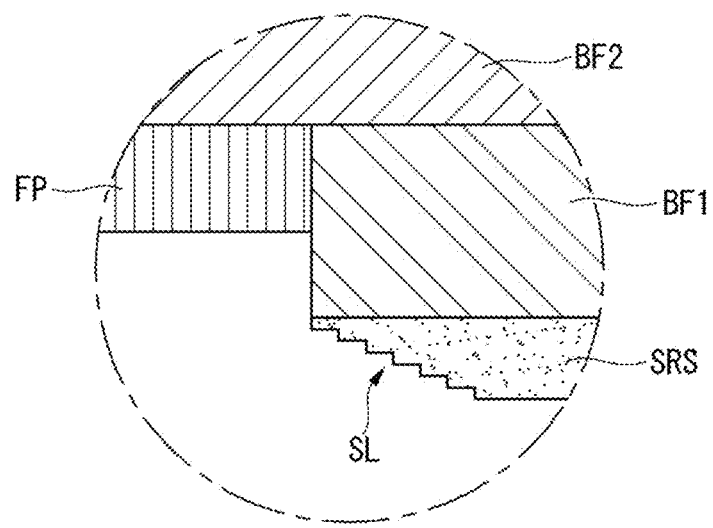
Figure 15:
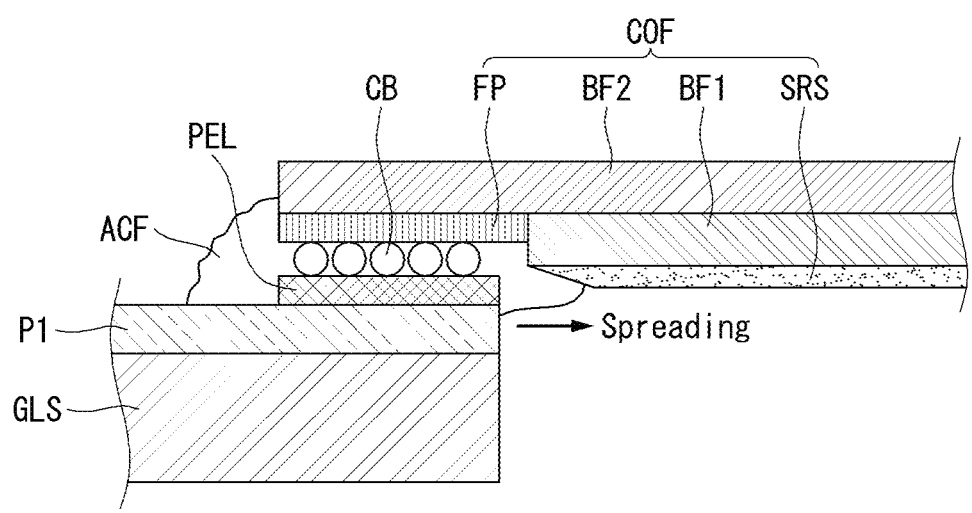
FIG. 15 is a cross-sectional view illustrating the spreading of an anisotropic conductive film.

FIG. 10 is a plan view of a chip-on film according to an embodiment of the disclosure. FIG. 11 is a cross-sectional view II-II' of a chip-on film according to an embodiment of the disclosure of FIG. 10. FIG. 12 is a plan view of a chip-on film according to another embodiment of the disclosure. FIGS. 13 and 14 are enlarged views of an area AA of FIG. 11. FIG. 15 is a cross-sectional view illustrating the spreading of an anisotropic conductive film.

Referring to FIGS. 10 and 11, a chip-on film COF according to an embodiment of the disclosure includes a first base film BF1 and a second base film BF2 that are attached to each other, a driver chip S-IC disposed on one surface of the first base film BF1, and film pad portions FP respectively disposed on both sides of the second base film BF2. Signal lines connected to the driver chip S-IC are disposed on the film pad portions FP.

The first base film BF1 and the second base film BF2 may be formed of a material having flexible characteristics, for example, polycarbonate, polyethylene terephthalate, polyimide, polyacrylate, polymethyl methacrylate, and the like. A plurality of signal lines is disposed between the first base film BF1 and the second base film BF2 and are connected to the driver chip S-IC. A size of one (for example, the first base film BF1) of the first base film BF1 and the second base film BF2 is smaller than a size of the second base film BF2, and thus the plurality of signal lines are exposed by the first base film BF1. The exposed signal lines form the film pad portions FP on both sides of the second base film BF2.

The embodiment of the disclosure includes a coating layer SRS on one surface of the first base film BF1. The coating layer SRS serves to guide an anisotropic conductive film to a chip-on film COF and is made of the same material as the anisotropic conductive film. In general, when a material "A" is coated again on a layer made of the material "A", the coating is easily performed because the wettability between the same materials is improved. The wettability refers to a degree to which a drop of water or liquid spreads on a surface when the water drop (or liquid drop) falls on the surface. For example, when a contact angle between the water drop and the surface is large, it can be said that the wettability is bad. Further, when a contact angle between the water drop and the surface is small, it can be said that the wettability is good. The embodiment of the disclosure can further spread the anisotropic conductive film to the coating layer SRS using the wettability by forming the coating layer SRS made of the same material as the anisotropic conductive film on the chip-on film COF.

The anisotropic conductive film is made of an adhesive with insulation and includes at least one of a thermosetting resin and a thermoplastic resin. Examples of the thermosetting resin may include a bisphenol-A epoxy resin, a bisphenol-F epoxy resin, a novolac epoxy resin, a phenol resin, a urea resin, a melamine resin, an unsaturated polyester resin, a resorcinol resin, and the like. However, the embodiments are not limited thereto. Examples of the thermoplastic resin may include a saturated polyester resin, a vinyl resin, an acrylic resin, a polyolefin resin, a polyvinyl acetate (PVA) resin, a polycarbonate resin, a cellulose resin, a ketone resin, a styrene resin, and the like. However, the embodiments are not limited thereto. The coating layer SRS may have a varied thickness, but such is not required. Accordingly, the coating layer SRS may be formed to have a constant thickness.

The coating layer SRS according to the embodiment of the disclosure is made of the same material as the anisotropic conductive film. For example, when the anisotropic conductive film is made of an epoxy-based resin, the coating layer SRS may be made of the same epoxy-based resin. In this instance, when the coating layer SRS is made of the same material having the same chemical formula as the anisotropic conductive film, the coating layer SRS can further spread the anisotropic conductive film to the coating layer SRS to have good characteristics. However, the embodiments are not limited thereto. The coating layer SRS may be made of a resin of the same kind as the anisotropic conductive film. For example, when the anisotropic conductive film is made of an epoxy-based resin, the coating layer SRS may be made of an epoxy-based resin. When the anisotropic conductive film is made of an acrylic-based resin, the coating layer SRS may be made of an acrylic-based resin.

The coating layer SRS according to the embodiment of the disclosure may be coated on the entire surface of the first base film BF1 of the chip-on film COF as shown in FIG. 10, or may be coated on a portion of the first base film BF1 of the chip-on film COF as shown in FIG. 12. As shown in FIG. 12, the coating layer SRS according to the embodiment of the disclosure may be coated from an edge of the first base film BF1 adjacent to the film pad portion FP and may have a width W2 that is more than two times a width W1 of the film pad portion FP.

More specifically, the chip-on film COF have a total of two film pad portions FP including a film pad portion connected to a pad portion of a substrate and a film pad portion connected to a printed circuit board (PCB). The coating layer SRS according to the embodiment of the disclosure is positioned adjacent to the film pad portion FP connected to the pad portion of the substrate and can prevent the anisotropic conductive film from overflowing to a lower part of the substrate. The coating layer SRS according to the embodiment of the disclosure may be coated from the edge of the first base film BF1 adjacent to the film pad portion FP and may have the width W2 that is more than two times the width W1 of the film pad portion FP. In a TAB process for attaching the chip-on film COF to the substrate, the anisotropic conductive film spreads out. In order to completely cover the spreading of the anisotropic conductive film, the coating layer SRS may have the width W2 that is more than two times the width W1 of the film pad portion FP.

The coating layer SRS according to the embodiment of the disclosure may have an inclined portion SL (or a taper) on one side, so that the anisotropic conductive film can well spread to the coating layer SRS.

As shown in FIG. 13, the inclined portion SL on one side of the coating layer SRS is formed in a continuously inclined shape not having a stepped portion. In this instance, the inclined portion SL has a taper angle of about 10° to 90° from the surface of the first base film BF1 and can well spread the anisotropic conductive film to the coating layer SRS. Further, as shown in FIG. 14, the inclined portion SL on one side of the coating layer SRS is formed in a discontinuously inclined shape having a stepped portion. For example, the inclined portion SL may be formed in a step shape. As shown in FIG. 15, when the coating layer SRS includes the inclined portion SL, in the TAB process, the anisotropic conductive film can well spread along the inclined portion SL at a boundary where the anisotropic conductive film ACF firstly contacts the coating layer SRS.

As described above, the chip-on film and the display device including the same according to the embodiment of the disclosure include the coating layer made of a material of the same kind as the anisotropic conductive film and can guide the anisotropic conductive film to well spread to the coating layer using the characteristics in which materials of the same kind have the good wettability.

Accordingly, the embodiment of the disclosure can easily perform a process for separating a support substrate by preventing the anisotropic conductive film, which overflows from the substrate, from attaching the support substrate to the substrate in the TAB process for attaching the chip-on film to the substrate.

Further, the embodiment of the disclosure can prevent a defective drive generated in a process for physically separating the support substrate from the substrate when the support substrate and the substrate are attached to each other by the anisotropic conductive film, thereby improving production yield.

Figure 16:
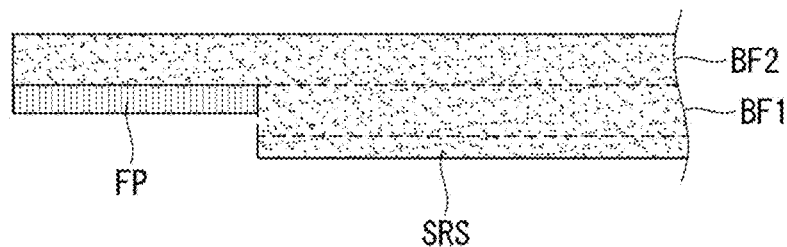
FIG. 16 is a cross-sectional view of a chip-on film according to another embodiment of the disclosure.
Figure 17:
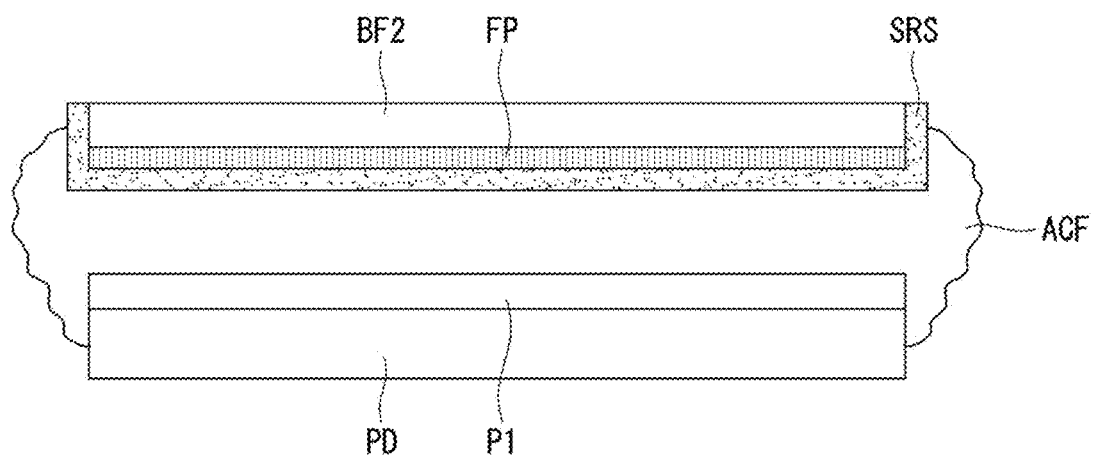
FIG. 17 is a cross-sectional view illustrating that a chip-on film is attached to a substrate.
Figure 18:
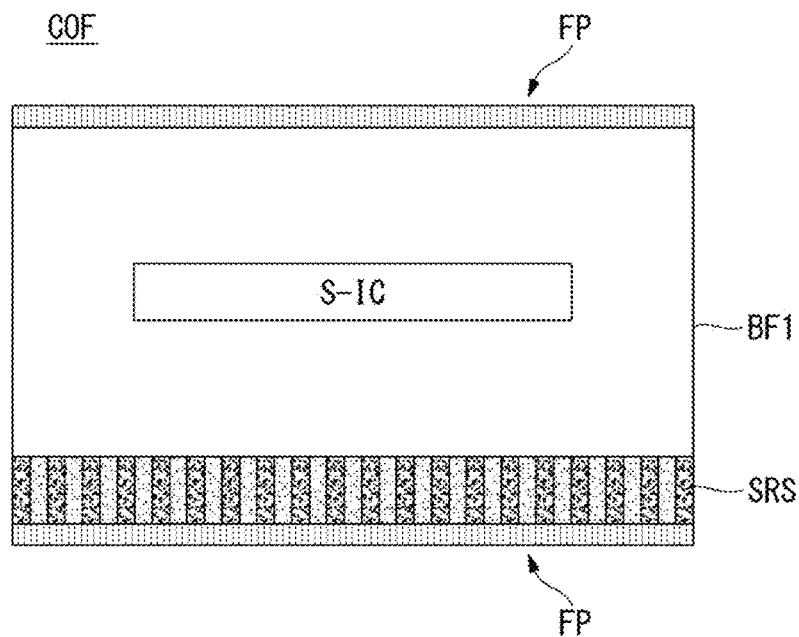
FIG. 18 is a plan view of a chip-on film according to another embodiment of the disclosure.
Figure 19:
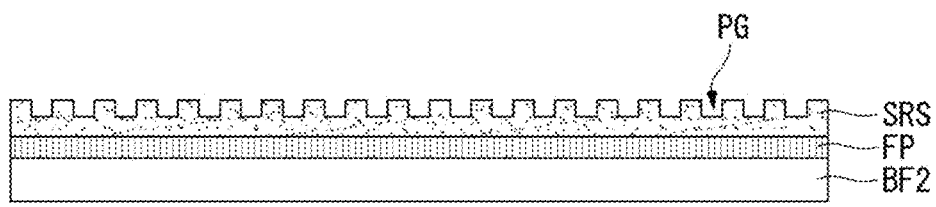
FIG. 19 is a cross-sectional view of FIG. 18.

FIG. 16 is a cross-sectional view of a chip-on film according to another embodiment of the disclosure. FIG. 17 is a cross-sectional view illustrating that a chip-on film is attached to a substrate. FIG. 18 is a plan view of a chip-on film according to another embodiment of the disclosure. FIG. 19 is a cross-sectional view of FIG. 18.

Referring to FIG. 16, in a chip-on film COF according to another embodiment of the disclosure, a coating layer SRS is disposed on one surface of a first base film BF1, and may be also disposed on the side of the chip-on film COF. Namely, the coating layer SRS may be disposed on the side of the second base film BF2 as well as the side of the first base film BF1.

Referring to FIG. 17, when the chip-on film COF is attached to a substrate PI, an anisotropic conductive film ACF spreads to the side of the substrate PI as well as a lower part of the substrate PI. In this instance, the anisotropic conductive film ACF rises along a lower surface and the side of the chip-on film COF. Thus, the embodiment of the disclosure includes the coating layer SRS on the side of the chip-on film COF, in order to well spread the anisotropic conductive film ACF rising along the side of the chip-on film COF.

The coating layer SRS according to the embodiment of the disclosure may have a plurality of uneven portions on the surface.

Referring to FIGS. 18 and 19, the coating layer SRS on the first base film BF1 have a plurality of uneven portions PG on the surface. The plurality of uneven portions PG is used to increase a surface area of the coating layer SRS and to improve the spreading of the anisotropic conductive film ACF by increasing a contact area between the anisotropic conductive film ACF and the coating layer SRS. The uneven portions PG are disposed to extend toward a driver chip S-IC. Thus, the anisotropic conductive film ACF can well spread along the uneven portions PG.

FIG. 18 illustrates that the coating layer SRS is formed only on a portion of the first base film BF1 by way of example. However, when the coating layer SRS is formed on the entire surface of the first base film BF1 as shown in FIG. 10, the coating layer SRS may have the uneven portions PG. Further, FIG. 19 illustrates the rectangular uneven portions PG by way of example. However, the embodiments are not limited thereto. The uneven portions PG may have various shapes including a circle, a triangle, a pentagon, etc. as long as they can or do increase the surface area of the coating layer SRS. In embodiments, the plurality of uneven portions PG may be evenly spaced.

Figure 20:
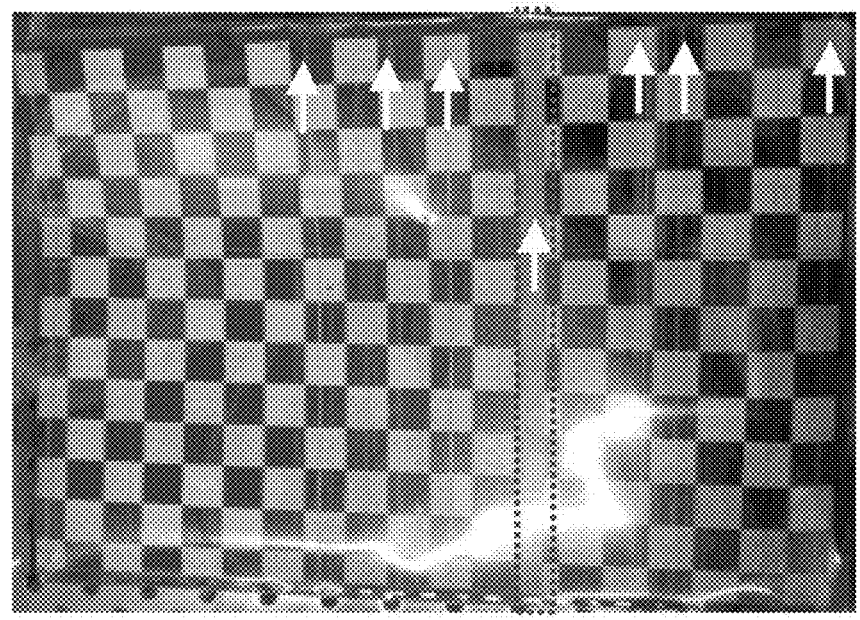
FIG. 20 is a driving image of a display device.
Figure 21:
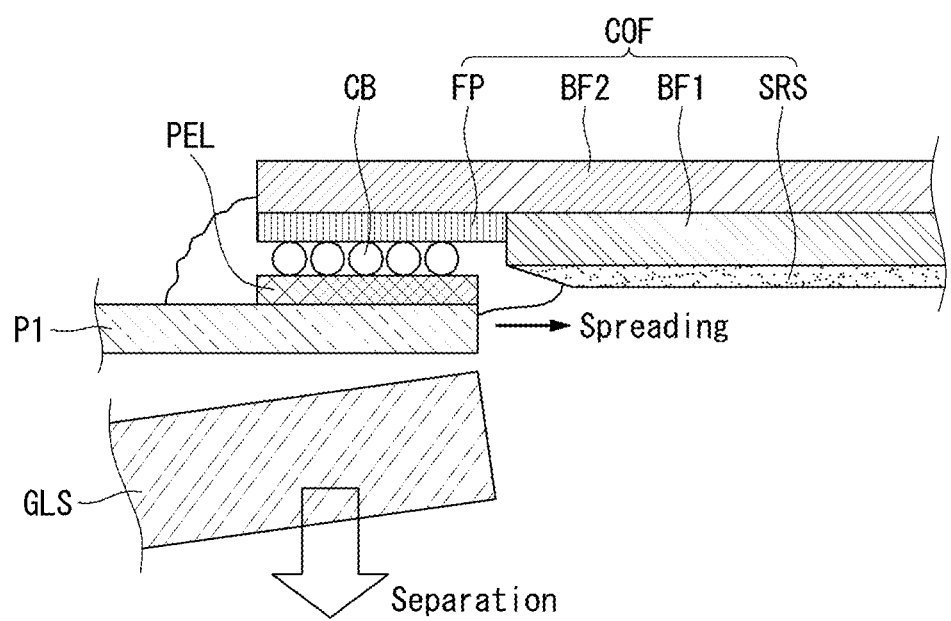
FIG. 21 is a cross-sectional view illustrating a separation process of a support substrate of a display device according to an embodiment of the disclosure.
Figure 22:
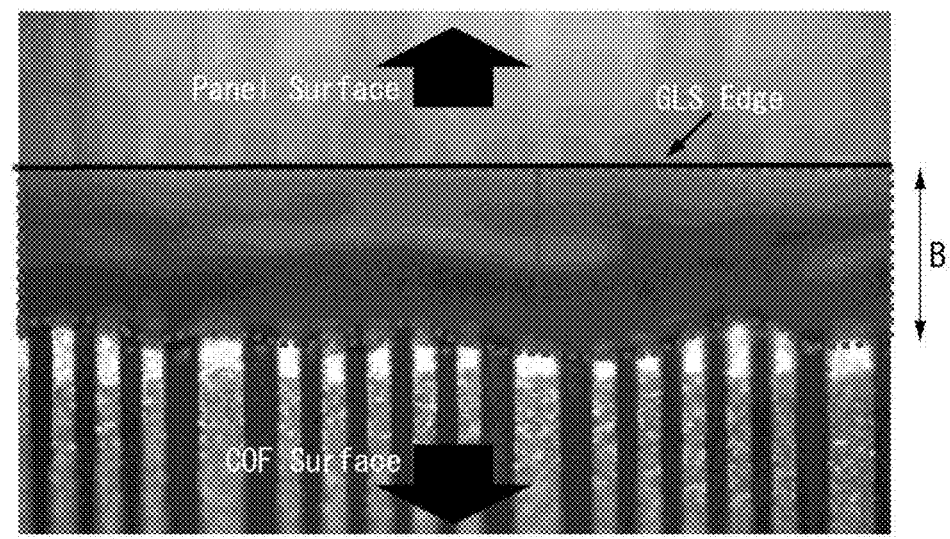
FIG. 22 is an image illustrating the spreading of an anisotropic conductive film of a display device according to an embodiment of the disclosure.
Figure 23:
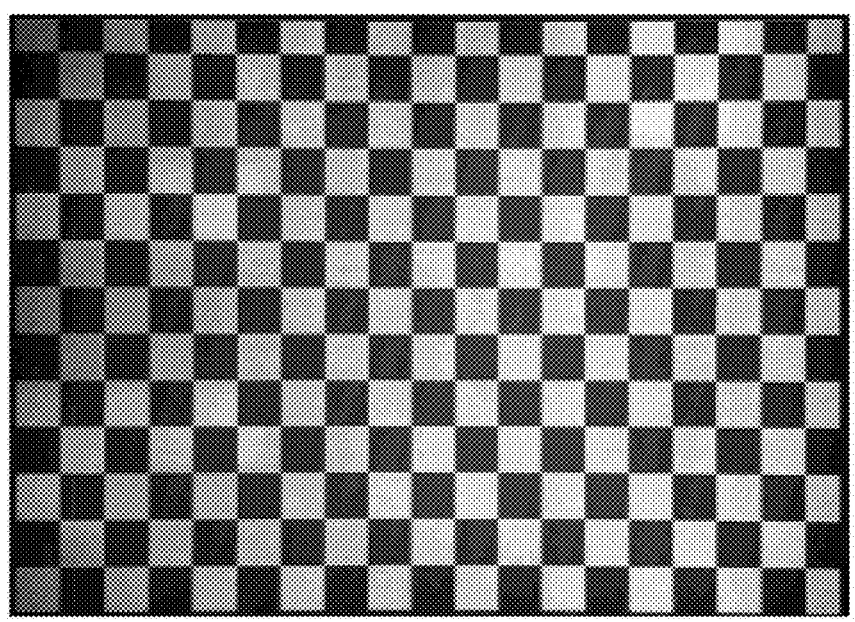
FIG. 23 is a driving image of a display device according to an embodiment of the disclosure.

FIG. 20 is a driving image of a display device. FIG. 21 is a cross-sectional view illustrating a separation process of a support substrate of a display device according to an embodiment of the disclosure. FIG. 22 is an image illustrating the spreading of an anisotropic conductive film of a display device according to an embodiment of the disclosure. FIG. 23 is a driving image of a display device according to an embodiment of the disclosure.

As described above with reference to FIGS. 8 and 9, in the TAB process of the chip-on film COF, the anisotropic conductive film ACF overflows from the substrate PI and is attached to the support substrate GLS below the substrate PI. In this instance, because the support substrate GLS is attached to the substrate PI in a separation process of the support substrate GLS, the support substrate GLS has to be physically separated from the substrate PI. However, as shown in FIG. 20, when the support substrate was physically separated from the substrate, the pad portion was damaged when the display device was driven, thereby causing a line defect.

On the other hand, as shown in FIG. 21, the display device according to the embodiment of the disclosure does not spread the anisotropic conductive film ACF to the support substrate GLS because the anisotropic conductive film ACF spreads along the coating layer SRS of the chip-on film COF in the TAB process of the chip-on film COF.

It can be seen from FIG. 22 that a spreading area of the anisotropic conductive film on the chip-on film greatly increased as compared to FIG. 9. Thus, the separation process between the substrate and the support substrate is well performed, and the physical separation process is not necessary. As shown in FIG. 23, when the physical separation process was not performed, the pad portion of the display device was not damaged. As a result, when the display device is driven, the display quality of the display device can be improved because there is no defect in the display device.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
   a flexible substrate;
   a display portion positioned on the flexible substrate, the display portion including an organic light emitting diode;
   a pad portion positioned at one edge of the flexible substrate such that one edge of the pad portion is aligned with the one edge of the flexible substrate; and
   a chip-on film connected to the pad portion through an anisotropic conductive film,
   wherein the chip-on film includes:
   a first base film disposed not to overlap with the flexible substrate;
   a second base film positioned on the first base film;

a film pad portion positioned on at least one side of the second base film to overlap with the pad portion and exposed to the outside of the first base film; and a coating layer positioned on one surface of the first base film near the anisotropic conductive film, the coating layer being made of a material of the same kind as the anisotropic conductive film, wherein a thickness of the first base film is greater than a thickness of the coating layer, wherein the coating layer is coated starting from an edge of the first base film adjacent to the film pad portion to enable the anisotropic conductive film to spread out by wettability between the coating layer and the anisotropic conductive film while the anisotropic conductive film is pressed, and cover the coating layer, wherein the coating layer is disposed not to overlap with the flexible substrate, and wherein the anisotropic conductive film is attached to lateral side surfaces of the pad portion and the flexible substrate located at the aligned edges of the pad portion and the flexible substrate.

2. The display device of claim 1, wherein the anisotropic conductive film and the coating layer each include:
   a thermosetting resin including at least one of a bisphenol-A epoxy resin, a bisphenol-F epoxy resin, a novolac epoxy resin, a phenol resin, a urea resin, a melamine resin, an unsaturated polyester resin or a resorcinol resin; or
   a thermoplastic resin including at least one of a saturated polyester resin, a vinyl resin, an acrylic resin, a polyolefin resin, a polyvinyl acetate (PVA) resin, a polycarbonate resin, a cellulose resin, a ketone resin or a styrene resin.

3. The display device of claim 1, wherein the anisotropic conductive film is disposed to extend from the pad portion to the coating layer of the chip-on film.

4. The display device of claim 1, wherein the coating layer is positioned on the one first surface of the first base film that is opposite from a surface of the first base film that contacts the second base film.

5. The display device of claim 1, wherein a width of the coating layer is more than two times a width of the film pad portion.

6. The display device of claim 1, wherein the coating layer includes an inclined portion on a side adjacent to the film pad portion.

7. The display device of claim 1, wherein the coating layer is positioned towards the film pad portion on the one first surface of the first base film.

8. The display device of claim 1, wherein the coating layer has a taper that is thinner towards the film pad portion.

9. The display device of claim 8, wherein the taper has a continuously inclined shape.

10. The display device of claim 9, wherein the taper has a taper angle of 10° to 90° relative to a surface of the first base film.

11. The display device of claim 8, wherein the taper has a discontinuously inclined shape having at least one stepped portion.

12. The display device of claim 1, wherein the anisotropic conductive film is further attached to a lateral side surface of the first base film located at the edge of the first base film.

13. The display device of claim 12, wherein a gap is present between the lateral sides surfaces of the flexible substrate and the first base film, and the anisotropic conductive film spans the gap.

14. A display device comprising:
   a flexible substrate;
   a display portion positioned on the flexible substrate, the display portion including an organic light emitting diode;
   a pad portion positioned on the flexible substrate such that one edge of the pad portion is aligned with one edge of the flexible substrate; and
   the chip-on film connected to the pad portion through an anisotropic conductive film, wherein the chip-on film includes:
   a first base film disposed not to overlap with the flexible substrate;
   a second base film positioned on the first base film;
   a film pad portion positioned on at least one side of the second base film to overlap with the pad portion and exposed to the outside of the first base film; and
   a coating layer positioned on one surface of the first base film near the anisotropic conductive film, the coating layer being made of a material of the same kind as the anisotropic conductive film,
   wherein the coating layer is made of a material of the same kind as the anisotropic conductive film to enable the anisotropic conductive film to spread out by wettability between the coating layer and the anisotropic conductive film while the anisotropic conductive film is pressed,
   wherein the coating layer is disposed not to overlap with the flexible substrate, and
   wherein the anisotropic conductive film is attached to lateral side surfaces of the pad portion and the flexible substrate located at the aligned edges of the pad portion and the flexible substrate.

15. The display device of claim 14, wherein the anisotropic conductive film and the coating layer each include:
   a thermosetting resin including at least one of a bisphenol-A epoxy resin, a bisphenol-F epoxy resin, a novolac epoxy resin, a phenol resin, a urea resin, a melamine resin, an unsaturated polyester resin or a resorcinol resin; or
   a thermoplastic resin including at least one of a saturated polyester resin, a vinyl resin, an acrylic resin, a polyolefin resin, a polyvinyl acetate (PVA) resin, a polycarbonate resin, a cellulose resin, a ketone resin or a styrene resin.

16. The display device of claim 14, wherein the anisotropic conductive film is further attached to a lateral side surface of the first base film located at the edge of the first base film.

17. The display device of claim 16, wherein a gap is present between the lateral sides surfaces of the flexible substrate and the first base film, and the anisotropic conductive film spans the gap.

* * * * *